United States Patent
Mohamed et al.

(10) Patent No.: US 10,546,081 B2
(45) Date of Patent: Jan. 28, 2020

(54) FULL MEMORY LOGICAL ERASE FOR CIRCUIT VERIFICATION

(71) Applicant: Mentor Graphics Corporation, Wilsonville, OR (US)

(72) Inventors: Khaled Salah Mohamed, Cairo (EG); Hans Erich Multhaup, Odelzhausen (DE); Robert John Bloor, Hertfordshire (GB)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 16/134,020

(22) Filed: Sep. 18, 2018

(65) Prior Publication Data

US 2019/0087522 A1  Mar. 21, 2019

Related U.S. Application Data

(60) Provisional application No. 62/560,907, filed on Sep. 20, 2017.

(51) Int. Cl.
| | |
|---|---|
| G06F 17/50 | (2006.01) |
| G11C 29/00 | (2006.01) |
| G06F 11/20 | (2006.01) |
| G06F 11/25 | (2006.01) |
| G11C 29/56 | (2006.01) |
| G06F 11/26 | (2006.01) |
| G11C 29/46 | (2006.01) |

(52) U.S. Cl.
CPC .......... *G06F 17/5027* (2013.01); *G06F 11/25* (2013.01); *G06F 11/261* (2013.01); *G06F 17/5045* (2013.01); *G11C 29/56* (2013.01); *G11C 29/46* (2013.01); *G11C 2029/5602* (2013.01)

(58) Field of Classification Search
CPC .... G06F 17/5027; G06F 11/261; G06F 11/25; G06F 17/5045; G11C 29/56; G11C 29/46; G11C 2029/5602; G11C 29/54
See application file for complete search history.

(56) References Cited

U.S. PATENT DOCUMENTS

| | | | |
|---|---|---|---|
| 6,904,400 B1* | 6/2005 | Peri | G11C 16/102 365/185.3 |
| 2009/0164203 A1* | 6/2009 | Norman | G06F 17/505 703/24 |
| 2011/0078362 A1* | 3/2011 | Scouller | G06F 12/0246 711/103 |
| 2011/0271035 A1* | 11/2011 | Scouller | G06F 12/0246 711/103 |

* cited by examiner

*Primary Examiner* — Stacy Whitmore

(57) ABSTRACT

A hardware model of a memory comprises: first circuitry configured to supply a memory status value for the memory which is changed upon a full-memory erase operation; second circuitry configured to supply a sector status value for each memory sector of the memory which is changed to a value equal to the memory status value when a write operation is performed on the each memory sector of the memory; and third circuitry configured to supply, when a read operation is performed on a memory sector of the memory, a value stored in the memory sector as output of the read operation if the sector status value for the memory sector is equal to the memory status value or a predefined value as the output of the read operation in other situations.

12 Claims, 5 Drawing Sheets

FIG. 3

Reconfigurable Hardware Modeling Device 310

Hardware Model of a Circuit Design 320

Hardware Model of a Memory 330

First circuitry 340

Second circuitry 350

Third circuitry 360

FULL MEMORY LOGICAL ERASE FOR CIRCUIT VERIFICATION

RELATED APPLICATIONS

This application claims the benefit of U.S. Provisional Patent Application No. 62/560,907, filed on Sep. 20, 2017, titled "A Novel Full Memory Logical Erase Method," and naming Khaled Salah Mohamed et al. as inventors, which application is incorporated entirely herein by reference.

FIELD OF THE DISCLOSED TECHNOLOGY

The present disclosed technology relates to the field of circuit design verification. Various implementations of the disclosed technology may be particularly useful for verifying a design including a flash memory.

BACKGROUND OF THE DISCLOSED TECHNOLOGY

Electronic circuits, such as integrated circuits, are used in a variety of products, from automobiles to smart phones to personal computers. Designing and fabricating these circuit devices typically involves many steps, known as a "design flow." The particular steps of a design flow often are dependent upon the type of integrated circuit being designed, its complexity, the design team, and the integrated circuit fabricator or foundry that will manufacture the circuit. Typically, software and hardware "tools" will verify a design at various stages of the design flow by running software simulators and/or hardware emulators/prototyping devices. The verification processes then are used to identify and correct errors in the design.

Several steps are common to most design flows. Typically, the specification for the new circuit initially is described at a very abstract level as a logical design. An example of this type of abstract description is a register transfer level (RTL) description of the circuit. With this type of description, the circuit is defined in terms of both the exchange of signals between hardware registers and the logical operations that are performed on those signals. A register transfer level design typically employs a Hardware Description Language (HDL) (sometimes also referred to as hardware design language or hardware definition language), such as the Very high speed integrated circuit Hardware Description Language (VHDL) or the Verilog language. The logic of the circuit is then analyzed, to confirm that the logic incorporated into the design will accurately perform the functions desired for the circuit. This analysis is sometimes referred to as "functional verification."

Logic simulation is a tool used for functional verification. Designing hardware today involves writing a program in the hardware description language. A simulation may be performed by running that program on a computer. Such an electronic design simulator can determine what the various states of an electronic design would be when presented with some input stimulus. Simulators are commercially available such as the QUESTA family of simulators from Mentor Graphics Corporations of Wilsonville, Oreg.

Software-based simulation, however, may be too slow for large complex designs such as SoC (System-on-Chip) designs. The speed of execution of a simulator drops significantly as the design size increases due to cache misses and memory swapping. Emulation and prototyping significantly increase verification productivity by employing reconfigurable hardware modeling devices including emulators and prototyping devices. Field programmable gate arrays (FPGAs)-based emulators and prototyping devices rely on an actual silicon implementation and perform circuit verification generally in parallel as the circuit design will execute in a real device. By contrast, a simulator performs circuit verification by executing the hardware description code serially. The different styles of execution can lead to orders of magnitude differences in execution time. Examples of hardware emulators include the VELOCE family of emulators available from Mentor Graphics Corporation of Wilsonville, Oreg., the ZEBU family of emulators available from Synopsys, Inc. of Mountain View, Calif., and the PALLADIUM family of emulators available from Cadence Design Systems of San Jose, Calif.

While reconfigurable hardware modeling device-based emulation and prototyping are much faster than simulation for system-on-chip designs, verifying circuit designs that have memory devices remains a challenge in some aspects. Using a conventional cycle-by-cycle erasing method, the run time for erasing a whole memory card at register-transfer level (RTL) can be extremely long. For instance, erasing a 2-GB memory instance byte-by-byte would last over 30 minutes, constituting a bottleneck of emulation. It is thus desirable to search for a fast whole-memory erasing method for circuit verification.

BRIEF SUMMARY OF THE DISCLOSED TECHNOLOGY

Various aspects of the present disclosed technology relate to techniques for full-memory erase during design verification. In one aspect, there is a system, comprising: a reconfigurable hardware modeling device programmed to implement a hardware model of a circuit design, the hardware model of the circuit design comprising: a hardware model of a memory, comprising: first circuitry configured to supply a memory status value for the memory, the first circuitry changing the memory status value when a full-memory erase operation is performed on the memory; second circuitry configured to supply a sector status value for each memory sector of the memory, the second circuitry changing the sector status value for a particular memory sector of the memory to a value equal to the memory status value when a write operation is performed on the particular memory sector of the memory; and third circuitry configured to supply, when a read operation is performed on a memory sector of the memory, a value stored in the memory sector as output of the read operation if the sector status value for the memory sector is equal to the memory status value or a predefined value as the output of the read operation in other situations.

The third circuitry may comprise fourth circuitry, the fourth circuitry configured to supply a sector tag value, the sector tag value for a particular memory sector of the memory being equal to a second predefined value in a read operation when the sector status value for the particular memory sector is equal to the memory status value or a third predefined value when the sector status value for the particular memory sector is not equal to the memory status value.

The first circuitry may change the memory status value by increasing the memory status value by one when a full-memory erase operation is performed on the memory.

The hardware model of the circuit design may further comprise: a hardware model of a processor, the hardware model of a processor conducting various memory operations on the hardware model of the memory.

The reconfigurable hardware modeling device may be a hardware emulator or an FPGA-based prototyping device. The memory may be a flash memory.

In another aspect, there is one or more non-transitory computer-readable media storing computer-executable instructions for causing one or more processors to generate bitstreams for programming a reconfigurable hardware modeling device to implement circuitry hardware models, the circuitry hardware models comprising: a hardware model of a circuit design, the hardware model of the circuit design comprising: a hardware model of a memory, comprising: first circuitry configured to supply a memory status value for the memory, the first circuitry changing the memory status value when a full-memory erase operation is performed on the memory; second circuitry configured to supply a sector status value for each memory sector of the memory, the second circuitry changing the sector status value for a particular memory sector of the memory to a value equal to the memory status value when a write operation is performed on the particular memory sector of the memory; and third circuitry configured to supply, when a read operation is performed on a specific memory sector of the memory, a value stored in the specific memory sector as output of the read operation if the sector status value for the specific memory sector is equal to the memory status value or a predefined value as the output of the read operation in other situations.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

FIG. 3 illustrates an example of a reconfigurable hardware modeling device 310 according to various embodiments of the disclosed technology.

DETAILED DESCRIPTION OF THE DISCLOSED TECHNOLOGY

General Considerations

Figure 1A:
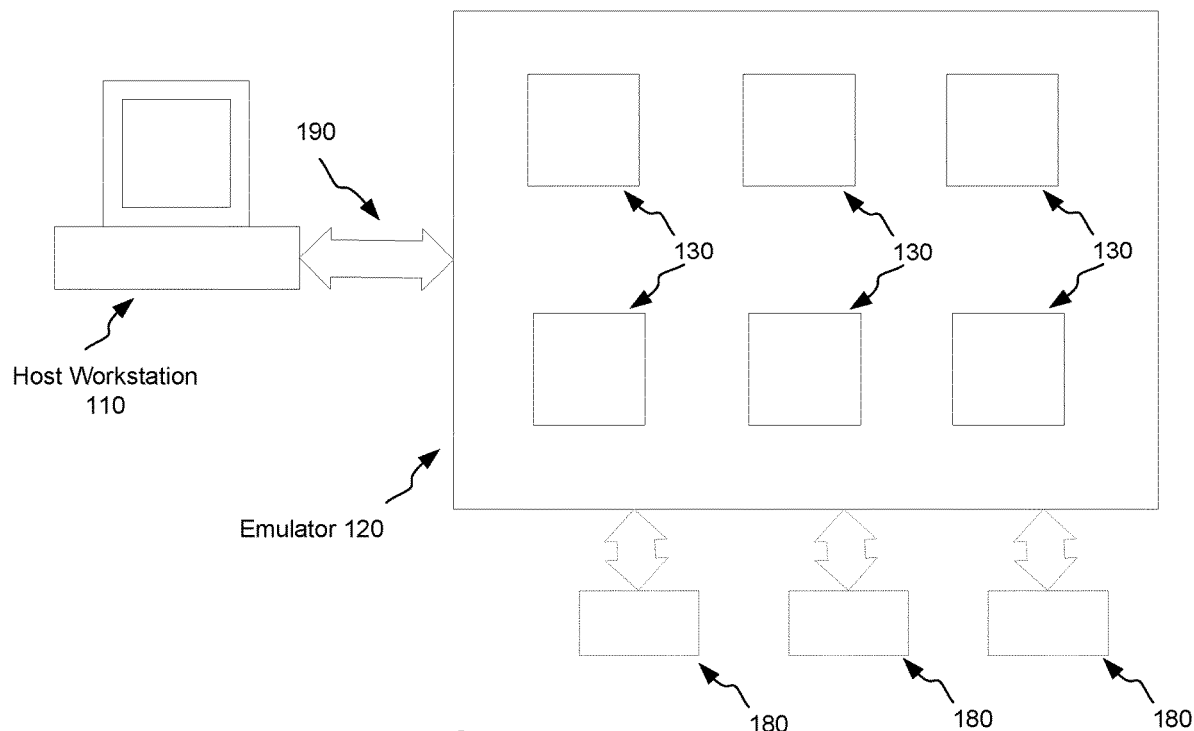
FIG. 1A shows an illustrative example of an emulation system with an emulator being coupled to targets.

Various aspects of the present disclosed technology relate to techniques for full-memory erase during design verification. In the following description, numerous details are set forth for the purpose of explanation. However, one of ordinary skill in the art will realize that the disclosed technology may be practiced without the use of these specific details. In other instances, well-known features have not been described in detail to avoid obscuring the present disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "supply", "configure" and "perform" to describe the disclosed methods/systems. Such terms are high-level descriptions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Illustrative Hardware Modeling Environment

Reconfigurable hardware modeling devices can be emulators or prototyping devices. Two types of emulators have been developed. The first type is FPGA-based. In an FPGA-based architecture, each FPGA chip has a network of prewired blocks of look-up tables and coupled flip-flops. A look-up table can be programmed to be a Boolean function, and each of the look-up tables can be programmed to connect or bypass the associated flip-flop(s). Look-up tables with connected flip-flops act as finite-state machines, while look-up tables with bypassed flip-flops operate as combinational logic. The look-up tables can be programmed to mimic any combinational logic of a predetermined number of inputs and outputs. To emulate a circuit design, the circuit design is first compiled and mapped to an array of interconnected FPGA chips. The compiler usually needs to partition the circuit design into pieces (sub-circuits) such that each fits into an FPGA chip. The sub-circuits are then synthesized into the look-up tables (that is, generating the contents in the look-up tables such that the look-up tables together produce the function of the sub-circuits). Subsequently, place and route are performed on the FPGA chips in a way that preserves the connectivity in the original circuit design.

The programmable logic chips employed by an emulator may be commercial FPGA chips or custom-designed emulation chips containing programmable logic blocks. A custom FPGA-based emulator can have a specially designed internal interconnection network of programmable elements within each custom FPGA, an external interconnecting network and I/O structure of custom FPGAs, and a design-under-test debug engine. Such architecture enables, compared to a commercial FPGA-based counterpart, fast and correct-by-construction compilation and high design visibility in the silicon fabric that assumes 100% access without probe compilation and rapid waveform tracing. A commercial FPGA chip may have somewhat larger capacity density than a custom FPGA chip. For a given design, a custom FPGA-based emulator may need more FPGAs than a commercial FPGA-based emulator, leading to larger physical dimensions and higher power consumption.

The second type of emulators is processor-based: an array of Boolean processors able to share data with one another is employed to map a circuit design, and Boolean operations are scheduled and performed accordingly. Similar to the FPGA-based, the circuit design needs to be partitioned into sub-circuits first so that the code for each sub-circuit fits the instruction memory of a processor. The compilation speed of a processor-based emulator, however, is much faster than those of a FPGA-based emulator. Drawbacks are limited speed of execution in a transaction-based mode, large power consumption, and large physical dimensions compared to a FPGA-based emulator.

An emulator may operate in various modes. In an in-circuit emulation mode, the emulator is connected with a user's target system to form a prototype of the system the user is designing. The emulator typically replaces the circuit being designed for the target system, allowing system-level and software testing prior to silicon availability. Although an emulator may run up to six orders of magnitude faster than a simulator, it is often not fast enough to run at the same speed of the physical target system (a few megahertz vs hundreds of megahertz). Speed rate adapters may be introduced between the target system and the emulator. A rate adapter behaves like a buffer. It caches the signal activity from the design-under-test (DUT) at emulation speed and sends it at real-time speed to the target system. Conversely, it captures the signal activity from the target system at full speed, caches it, and then sends it back to the DUT at emulation speed. Even when a rate adapter is available, the constant evolution of speed and complexity of individual I/O protocols may make timely rate adapter development difficult.

In an acceleration mode, the physical target system is replaced by a virtual target system modelled via one of the high-level languages such as SystemVerilog, SystemC, or C++. The acceleration mode leverages the existing simulation testbench and removes the need for external rate adapters. The testbench creates test vectors and check corresponding responses of the circuit model. In addition to the elimination of speed adapters, the acceleration mode has advantages such as no hardware dependencies, the ability to use the emulator remotely, and the ability to run verification of corner cases.

The acceleration mode can be cycle-based or transaction-based. The cycle-based acceleration mode employs a signal-level or bit-level interface connecting the testbench processed by the host workstation to the design mode on the emulator. Each and every transition on each and every interface signal must be transferred between the testbench and the design model at the slow speed of the testbench simulated in the workstation. As a result, the speed of the emulator is wasted waiting to carry out these signal transfers.

The transaction-based acceleration reduces the traffic between workstation and emulator by replacing bit-by-bit exchanges with transaction exchanges. Data exchange is through so-called transactors. A transactor, including a front-end proxy interface on the workstation or host computer, a back-end bus-functional model on the emulator and a physical communication channel between the host computer and the emulator, converts high-level commands from the testbench on the host computer into signal-level bit sequences required by the design-under-test model on the emulator, and vice versa. This allows data being streamed and buffered between the testbench and the design-under-test, speeding up the execution of the testbench. A design team can thus access the full performance of the emulator. In addition to performance, the transaction-based emulation eliminates the need for rate adapters. The design-under-test can connect to a "virtual device" (a software model of the device) that runs on the host computer through a transaction-level interface or to a physical device through a transaction-level interface and a "virtual device" acting as a bridging device.

In addition to emulators, reconfigurable hardware modeling devices also include FPGA prototyping devices. FPGA prototyping is typically deployed near the end of the verification process to catch system-level issues. For designs that rely heavily on commercial intellectual property (IP), an FPGA-based prototype is an ideal test platform for ensuring all IP components perform together. An FPGA-based prototype can also serve as a vehicle for software development and validation. Embedded software has become the dominant part of the effort in modern System-on-Chip (SoC) design. FPGA prototyping provides software developers early access to a fully functioning hardware platform well before real silicon. This enables early software development tasks such as operating system (OS) integration and application testing. The increased productivity of software development and validation greatly accelerates a product's time-to-market.

Compared to FPGA-based emulators which typically operate at one to two million cycles per second, FPGA prototypes are designed and built to achieve the highest speed of execution possible, allowing the extension of the speed range into tens of megahertz. The downside to FPGA prototyping is capacity limitations, limited debugging capabilities and long bring-up time. With growing complexity of FPGAs and advancement in both emulation and prototyping technologies, the lines between FPGA-based prototyping and emulation are increasingly blurring.

In some embodiments, the disclosed technology may be implemented as part of a hardware emulation environment, such as the one illustrated in FIG. 1A. As seen in this figure, the hardware emulation environment includes an emulator 120 coupled to a host computer or workstation 110. The workstation 110 may be implemented by one or more computing systems. One computing system may include a single computer or multiple computers (e.g., a master computer and a plurality of slave computers). The workstation provides the capability to load the DUV (design-underverification, also referred to as DUT—design under test) model into the emulator, controls the execution of the DUT model on the emulator over time, and serves as a debugging interface into the DUV model on the emulator. As discussed previously, the workstation may include the testbench and perhaps other software models in some of the operational modes.

The emulator 120 includes multiple printed circuit boards (emulation circuit boards) 130. These emulation circuit boards 130 are networked (not shown). A circuit design may be partitioned by the workstation 110 and loaded to the emulation circuit boards 130 for emulation.

In the in-circuit emulation mode, one or more targets 180 may be coupled to the emulator 120 as shown in FIG. 1A. In some simple environments, a target may be a piece of test equipment that generates and verifies test data such as a network tester. In other environments, the target can be the actual circuitry with which the DUT model will interact in its final application (e.g., other hardware components of the system for which the DUT model is designed). A target can be either a static target or a dynamic target, depending on whether design clock signals run in the emulator can be suspended or not.

Figure 1B:
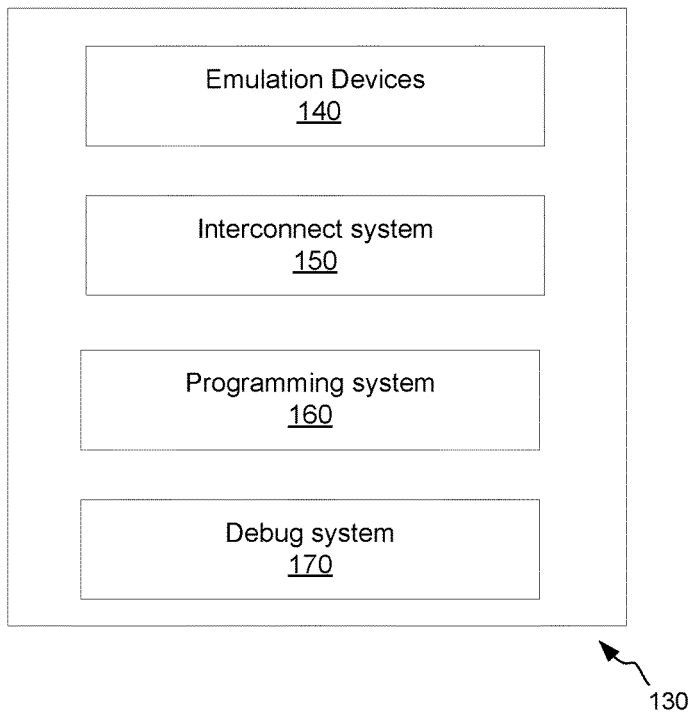
FIG. 1B shows an illustrative example of an emulation circuit board.

FIG. 1B illustrates an example of an emulation circuit board 130. The emulation circuit board 130 includes an array of emulation devices 140. The emulation devices 140 can be programmed to model, for example, combinatorial logic components, sequential circuit components and memories. The emulation devices 140 may be processor-based or FPGA-based.

Also included in the emulation circuit board 130 are a configurable interconnect system 150, a programming system 160, and a debug system 170. A portion of a circuit design on one emulation device may need data computed by another portion of the design on another emulation device. The configurable interconnect system 150 allows data to be moved between emulation devices 140. In some implementations, the configurable interconnect system 150 may include a cross-bar device, a multiplexer, some other configurable network, or any combination thereof.

The programming system 160 enables a variety of other types of data to be brought in or out from an emulation device 140. Examples include programming data to configure an emulation device to perform a particular function, visibility data collected from the debug system 170 to be brought to the host workstation 110 for display, and content data either read from or written to memory circuitry in an emulation device 140.

The debug system 170 enables the emulation system to monitor the behavior of a modeled circuit design. Needed data for visibility viewing purposes can be stored in the debug system 170. The debug system 170 may also provide resources for detecting specific conditions occurring in the circuit design. Such condition detection is sometimes referred to as triggering.

The emulator 120 is coupled to the host workstation 110 through an interface system 190. The interface system 190 comprises one or more interfaces. A typical interface is optimized to transport large amounts of data such as data containing the emulated circuit design model (e.g., FPGA configuration bitstreams), initial contents of registers and design memories and data for debugging purposes. This interface is independent of design-under-test and may comprise dedicated logic or programmed logic in the emulator.

The interface system may also comprise one or more transaction-level interfaces. These interfaces may be optimized for small packets of data and fast streaming speed. The speed may be, for example, in the order of 2-3 Gigabits per second. The communication is performed through transactors as discussed previously. A transactor includes a back-end bus-functional model—instrumented logic in the emulator model, which requires the emulator infrastructure clock keep running even though the design clocks can be stopped.

It should also be appreciated that the emulation system in FIG. 1A and the emulation circuit board 130 in FIG. 1B are illustrated as examples only, and they are not intended to be limiting. Various embodiments of the disclosed technology may be implemented using only a subset of the components illustrated in the figures, or include an alternate combination of components, including components that are not shown in the figures.

Illustrative Computer-Based Operating Environment

Figure 2:
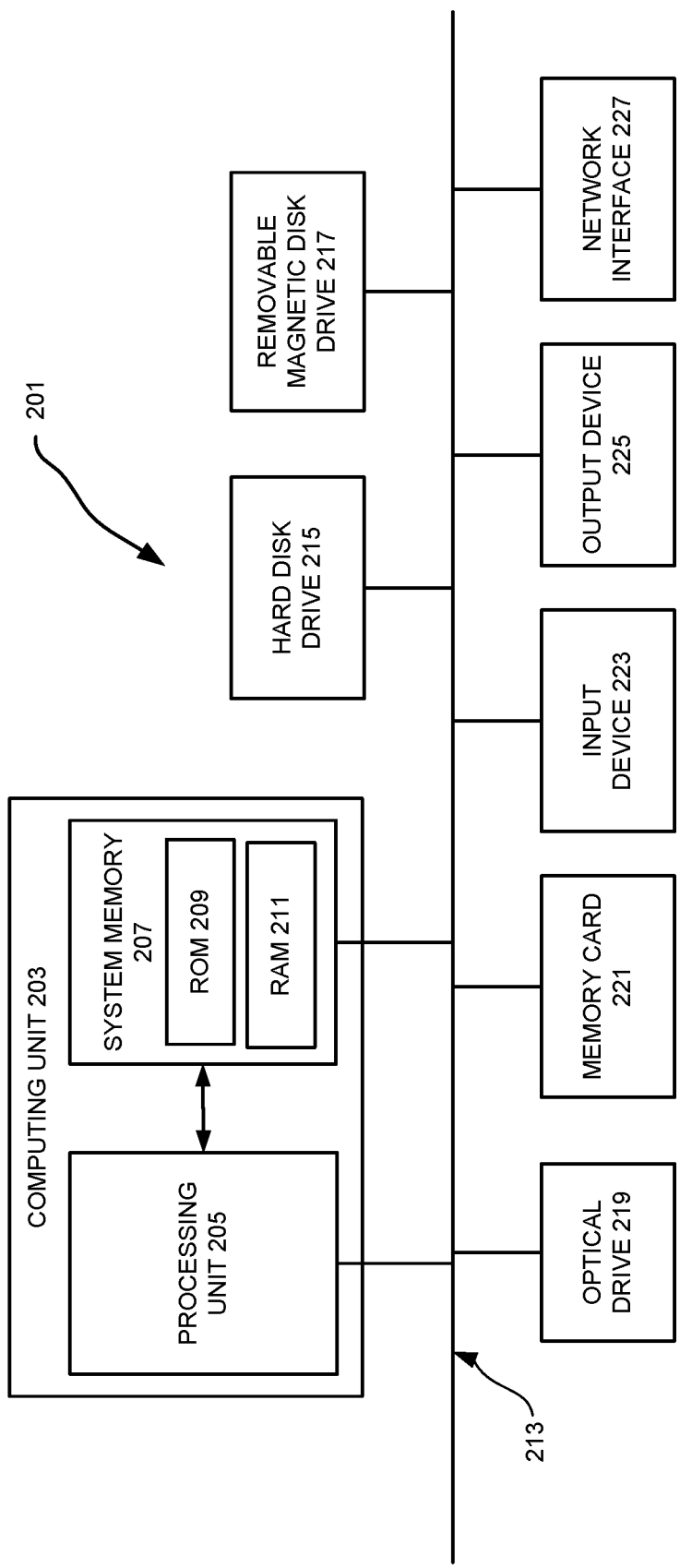
FIG. 2 illustrates a programmable computer system with which various embodiments of the disclosed technology may be employed.

FIG. 2 shows an illustrative example of a computing device 201 which may serve as the workstation 110 and/or implement various embodiments of a part or whole of the disclosed technology. As seen in this figure, the computing device 201 includes a computing unit 203 with a processing unit 205 and a system memory 207. The processing unit 205 may be any type of programmable electronic device for executing software instructions, but will conventionally be a microprocessor. The system memory 207 may include both a read-only memory (ROM) 209 and a random access memory (RAM) 211. As will be appreciated by those of ordinary skill in the art, both the read-only memory (ROM) 209 and the random access memory (RAM) 211 may store software instructions for execution by the processing unit 205.

The processing unit 205 and the system memory 207 are connected, either directly or indirectly, through a bus 213 or alternate communication structure, to one or more peripheral devices. For example, the processing unit 205 or the system memory 207 may be directly or indirectly connected to one or more additional memory storage devices, such as a "hard" magnetic disk drive 215, a removable magnetic disk drive 217, an optical disk drive 219, or a flash memory card 221. The processing unit 205 and the system memory 207 also may be directly or indirectly connected to one or more input devices 223 and one or more output devices 225. The input devices 223 may include, for example, a keyboard, a pointing device (such as a mouse, touchpad, stylus, trackball, or joystick), a scanner, a camera, and a microphone. The output devices 225 may include, for example, a monitor display, a printer and speakers. With various examples of the computer 201, one or more of the peripheral devices 215-225 may be internally housed with the computing unit 203. Alternately, one or more of the peripheral devices 215-225 may be external to the housing for the computing unit 203 and connected to the bus 213 through, for example, a Universal Serial Bus (USB) connection.

With some implementations, the computing unit 203 may be directly or indirectly connected to one or more network interfaces 227 for communicating with other devices making up a network. The network interface 227 translates data and control signals from the computing unit 203 into network messages according to one or more communication protocols, such as the transmission control protocol (TCP) and the Internet protocol (IP). Also, the interface 227 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 201 is illustrated as an example only, and it not intended to be limiting.

Various embodiments of the disclosed technology may be implemented using one or more computing devices that include the components of the computer 201 illustrated in FIG. 2, which include only a subset of the components illustrated in FIG. 2, or which include an alternate combination of components, including components that are not shown in FIG. 2. For example, various embodiments of the disclosed technology may be implemented using a multiprocessor computer, a plurality of single and/or multiprocessor computers arranged into a network, or some combination of both.

Full Memory Logical Erase

FIG. 3 illustrates an example of a reconfigurable hardware modeling device 310 according to various embodiments of the disclosed technology. The reconfigurable hardware modeling device 310 comprises a hardware model of a circuit design 320. The hardware model of the circuit design 320 comprises a hardware model of a memory 330. The memory in the circuit design may be a flash memory such as a NAND (Not-AND)-type flash memory. The hardware model of the memory 330 comprises first circuitry 340, second circuitry 350, and third circuitry 360. It should be noted that FIG. 3 does not intend to show the relative size of the hardware components. For example, the hardware model of the memory 330 may be just one of several devices in the hardware model of the circuit design 320. Typically, the hardware model of the circuit design 320 may also comprise at least one hardware model of logic circuitry. The hardware model of the circuit design 320 may further comprises a hardware model of another memory.

The first circuitry 340 is configured to supply a memory status value for the memory. The first circuitry 340 changes the memory status value when a full-memory erase operation is performed on the memory. For a NAND-type of flash memory, the full-memory erase operation is performed on a block basis, and for a NOR (Not-OR)-type flash memory, the full-memory erase operation may be performed on a word basis. According to some embodiments of the disclosed technology, the first circuitry 340 may be implemented with a counter circuit. After each full-memory erase operation, the memory status value will increase by one. It should be appreciated by a person of ordinary skill in the art that the first circuitry 340 can change the memory status value after each full-memory erase operation by different numbers including negative numbers according to different implementations of the disclosed technology.

The second circuitry 350 is configured to supply a sector status value for each memory sector of the memory. A sector may be a block of a memory or a word of a memory. The size of a sector may be, for example, 512 bytes. The second circuitry 350 changes the sector status value for a memory sector of the memory to a value equal to the memory status value when a write operation is performed on the memory sector of the memory. The second circuitry 350 may use an array to store the sector status values for the sectors of the memory.

The third circuitry 360 is configured to supply, when a read operation is performed on a memory sector of the memory, a value stored in the memory sector as output of the read operation if the sector status value for the memory sector is equal to the memory status value or a predefined value as the output of the read operation in other situations. In a conventional method, a full memory erase operation typically includes erasing every sector of the memory, which means the number of sub-operations is equal to the number of sectors. By contrast, a full memory erase operation performed on a model of the memory according to various embodiments of the disclosed technology can use only one sub-operation: changing one global parameter—the memory status value, avoiding the time-consuming sector-by-sector erase operation. Based on the global memory status value and a sector-specific parameter—the sector status value, the third circuitry 360 can output a correct value in response to a read operation, functionally equivalent to a conventional full-memory erase operation. Specifically, the sector status value will be changed to a value not equal to the sector status value for any sector after a full-memory erase operation no matter whether they were equal or not before the full-memory erase operation. A write operation can change the sector status value(s) of some specific sectors back to be equal to the current memory status value. Only these specific sectors will output values different from the pre-set value. As such, the disclosed technology can greatly speed up a full memory erase operation while not significantly affecting the speeds of read and write operations.

Figure 4:
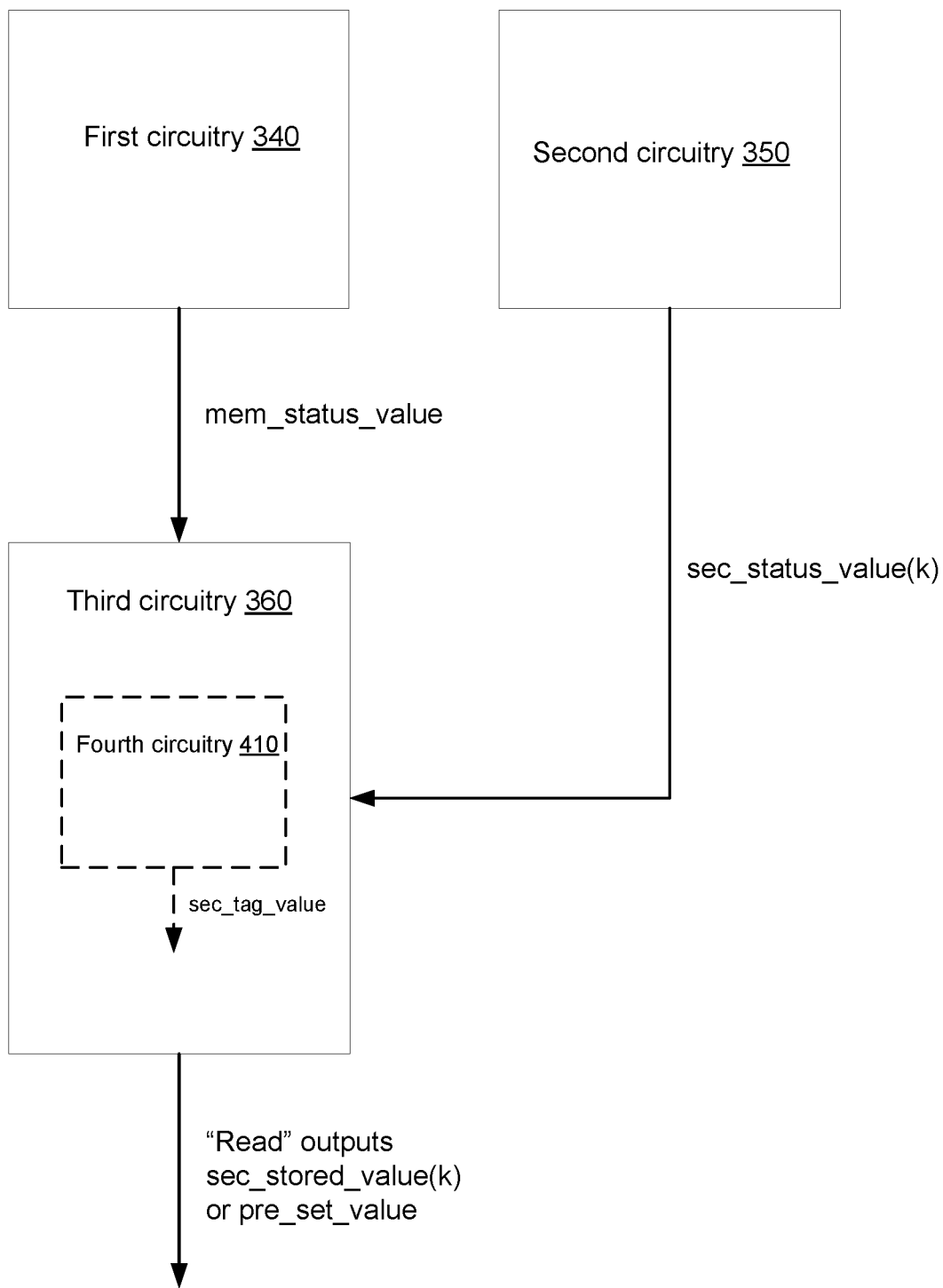
FIG. 4 illustrates an example how the first circuitry 340, the second circuitry 350 and the third circuitry 360 shown in FIG. 3 work together to ensure a correct output for a read operation according to various embodiments of the disclosed technology.

FIG. 4 illustrated an example how the first circuitry 340, the second circuitry 350 and the third circuitry 360 work together to ensure a correct output for a read operation according to various embodiments of the disclosed technology. In the figure, the memory status value is labeled as "mem_status_value", and the sector status value for sector k is labeled as "sec_status_value(k)". If mem_status_value equals sec_status_value(k), the third circuitry 360 outputs the content stored in sector k (labeled as "sec_stored_value (k)") in response to a read operation on sector k. If mem_status_value does not equal sec_status_value(k), the third circuitry 360 outputs a preset value (labeled as "pre_set_value") for sector k. The preset value is the same for all sectors of the memory.

The third circuitry 360 may comprise fourth circuitry 410 according to some embodiments of the disclosed technology, as shown in FIG. 4. The fourth circuitry 410 is configured to supply a section tag value (labeled as "sec_tag_value") for each sector based on the corresponding sector status value and the memory status value. The section tag value changes to some predefined values upon some read or write operations, which will be discussed in detail below. The third circuitry 360 may decide the output value in response to a read option based directly on the section tag value rather than the comparison result between the sector status value and the memory status value.

Figure 5:
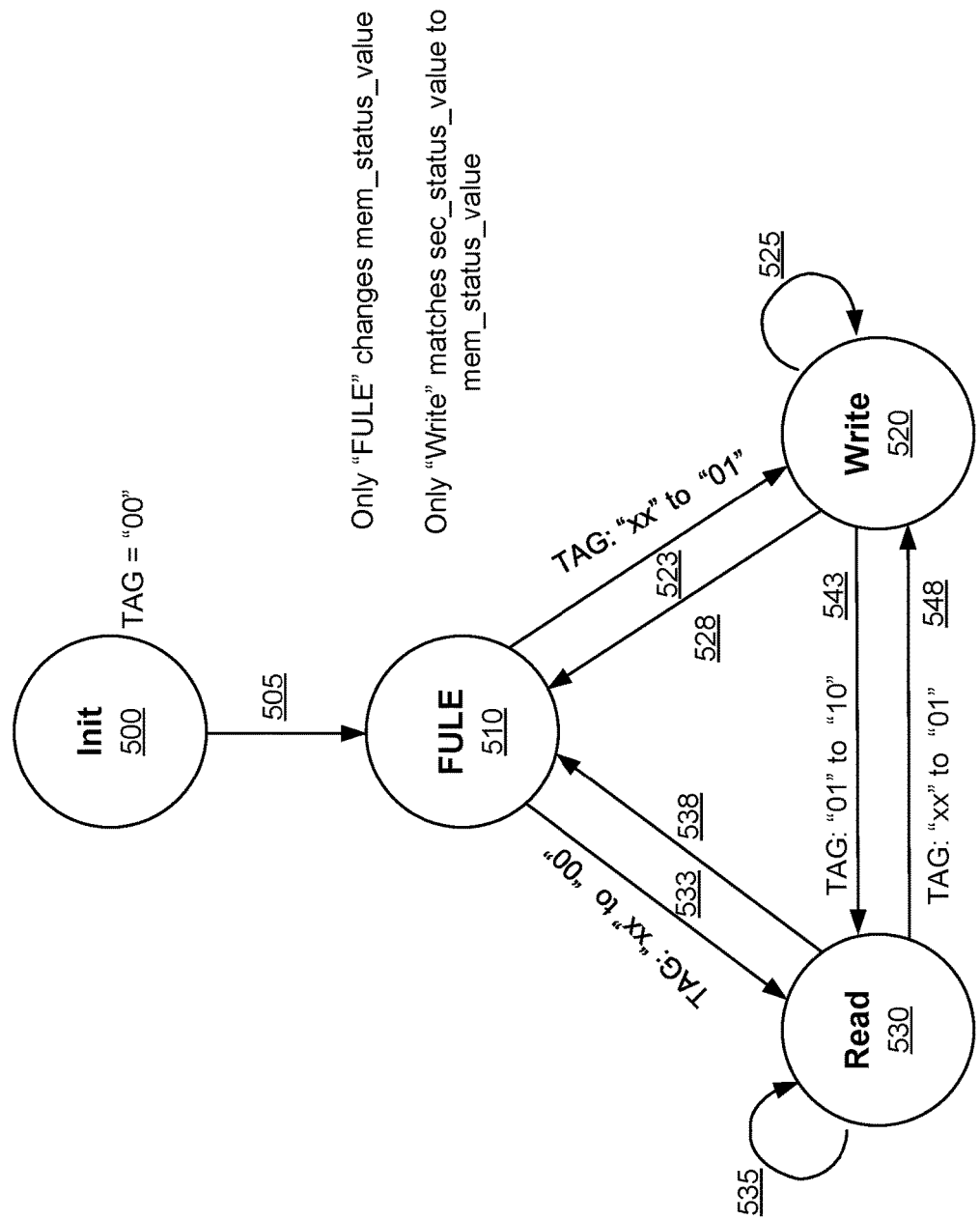
FIG. 5 illustrates an example of a finite state machine for describing memory operations according to various embodiments of the disclosed technology.

FIG. 5 illustrates an example of a finite state machine for describing memory operations according to various embodiments of the disclosed technology. There are four states in the figure: initialization 500 (labeled as "Init"), full memory (logical) erase 510 (labeled as "FULE"), write 520 (labeled as "Write"), and read 530 (labeled as "Read"). The nine arrows representing nine different operations connect the four states. These operations may have a different effects on the memory status value, the section status value and/or the optional section tag value. Table one summarizes the nine operations and their corresponding effects according to some embodiments of the disclosed technology.

TABLE I

| Arrow | Operation | Mem_status | Sector_status | Sector_tag |
|---|---|---|---|---|
| 505 | FULE after Init | change | no change | no change |
| 528 | FULE after Write | change | no change | no change |
| 538 | FULE after Read | change | no change | no change |
| 523 | Write after FULE | no change | match Mem_status | Change to 01 |
| 533 | Read after FULE | no change | no change | Change to 00 |
| 535 | Read after Read | no change | no change | no change |

TABLE I-continued

| Arrow | Operation | Mem_status | Sector_status | Sector_tag |
|---|---|---|---|---|
| 525 | Write after Write | no change | no change | no change |
| 543 | Read after Write | no change | no change | Change to 10 |
| 548 | Write after Read | no change | match Mem_status | Change to 01 |

In the table, FULE represents full memory erase, Init represents initialization, Mem_status represents memory status value, Sector_status represents sector status value, and Sector_tag represents sector tag value.

Table II lists an example of fourteen memory operations according to some embodiments of the disclosed technology.

TABLE II

| Seq. | Op. | M_stat | S_stat(1) | S_tag(1) | S_stat(2) | S_tag(2) | Output |
|---|---|---|---|---|---|---|---|
| 1 | Init. | 0 | 0 | 00 | 0 | 00 | |
| 2 | FULE | 1 | 0 | 00 | 0 | 00 | |
| 3 | Write(1) | 1 | 1 | 01 | 0 | 00 | |
| 4 | Read(2) | 1 | 1 | 01 | 0 | 00 | 0 |
| 5 | Read(1) | 1 | 1 | 10 | 0 | 00 | data(1) |
| 6 | FULE | 2 | 1 | 10 | 0 | 00 | |
| 7 | Write(2) | 2 | 1 | 10 | 2 | 01 | |
| 8 | Read(1) | 2 | 1 | 00 | 2 | 01 | 0 |
| 9 | Read(2) | 2 | 1 | 00 | 2 | 10 | data(2) |
| 10 | Write(1) | 2 | 2 | 01 | 2 | 10 | |
| 11 | Write(2) | 2 | 2 | 01 | 2 | 01 | |
| 12 | Read(1) | 2 | 2 | 10 | 2 | 01 | data(1) |
| 13 | Read(2) | 2 | 2 | 10 | 2 | 10 | data(2) |
| 14 | FULE | 3 | 2 | 10 | 2 | 10 | |

In the table, "Seq." represents the sequence of memory operations, "Op." represents the type of memory operations, "M_stat" represents memory status value, "S_stat(k)" represents sector status value for sector k, "S_tag(k)" represents sector tag value for sector k, "Output" represents an output value in response to a read operation, "FULE" represents full memory erase, "Init." represents initialization, "Writer(k)"/"Read(k)" represents write/read section k, and "data (k)" represents data stored in section k. As Table II shows, the third circuitry 360 can output a preset value "0" or data stored in the particular sector based directly on comparing M_stat with S_stat(k) or on S_tag(k) alone if the third circuitry 360 comprises the fourth circuitry 410. As noted previously, the fourth circuitry 410 decides S_tag(k) based on M_stat with S_stat(k).

In addition to a reconfigurable hardware modeling device such as the one shown in FIG. 3, the disclosed technology can include a software tool that can cause one or more processors to generate bitstreams for programming a reconfigurable hardware modeling device to implement circuitry hardware models shown in FIG. 3. The software tool can be stored on one or more non-transitory computer-readable media. The term "non-transitory computer-readable medium" refers to computer-readable medium that are capable of storing data for future retrieval and not propagating electro-magnetic waves. The non-transitory computer-readable medium may be, for example, a magnetic storage device, an optical storage device, or a solid state storage device. The one or more processors may be part of a computer system such as the one shown in FIG. 2.

CONCLUSION

While the disclosed technology has been described with respect to specific examples including presently preferred modes of carrying out the disclosed technology, those skilled in the art will appreciate that there are numerous variations and permutations of the above described systems and techniques that fall within the spirit and scope of the disclosed technology as set forth in the appended claims. For example, while specific terminology has been employed above to refer to electronic design automation processes, it should be appreciated that various examples of the disclosed technology may be implemented using any desired combination of electronic design automation processes.

What is claimed is:

1. A system, comprising:
   a reconfigurable hardware modeling device programmed to implement a hardware model of a circuit design, the hardware model of the circuit design comprising:
   a hardware model of a memory, comprising:
      first circuitry configured to supply a memory status value for the memory, the first circuitry changing the memory status value when a full-memory erase operation is performed on the memory;
      second circuitry configured to supply a sector status value for each memory sector of the memory, the second circuitry changing the sector status value for a particular memory sector of the memory to a value equal to the memory status value when a write operation is performed on the particular memory sector of the memory; and
      third circuitry configured to supply, when a read operation is performed on a specific memory sector of the memory, a value stored in the specific memory sector as output of the read operation if the sector status value for the specific memory sector is equal to the memory status value or a predefined value as the output of the read operation in other situations.

2. The system recited in claim 1, wherein the third circuitry comprises fourth circuitry, the fourth circuitry configured to supply a sector tag value, the sector tag value for a particular memory sector of the memory being equal to a second predefined value in a read operation when the sector status value for the particular memory sector is equal to the memory status value or a third predefined value when the sector status value for the particular memory sector is not equal to the memory status value.

3. The system recited in claim 1, wherein the first circuitry changes the memory status value by increasing the memory status value by one when a full-memory erase operation is performed on the memory.

4. The system recited in claim 1, wherein the reconfigurable hardware modeling device is a hardware emulator or an FPGA-based prototyping device.

5. The system recited in claim 1, wherein the hardware model of the circuit design further comprises:
a hardware model of a processor, the hardware model of a processor conducting various memory operations on the hardware model of the memory.

6. The system recited in claim 1, wherein the memory is a flash memory.

7. One or more non-transitory computer-readable media storing computer-executable instructions for causing one or more processors to generate bitstreams for programming a reconfigurable hardware modeling device to implement circuitry hardware models, the circuitry hardware models comprising:
a hardware model of a circuit design, comprising:
a hardware model of a memory, comprising:
first circuitry configured to supply a memory status value for the memory, the first circuitry changing the memory status value when a full-memory erase operation is performed on the memory;
second circuitry configured to supply a sector status value for each memory sector of the memory, the second circuitry changing the sector status value for a particular memory sector of the memory to a value equal to the memory status value when a write operation is performed on the particular memory sector of the memory; and
third circuitry configured to supply, when a read operation is performed on a specific memory sector of the memory, a value stored in the specific memory sector as output of the read operation if the sector status value for the specific memory sector is equal to the memory status value or a predefined value as the output of the read operation in other situations.

8. The one or more non-transitory computer-readable media recited in claim 7, wherein the third circuitry comprises fourth circuitry, the fourth circuitry configured to supply a sector tag value, the sector tag value for a particular memory sector of the memory being equal to a second predefined value in a read operation when the sector status value for the particular memory sector is equal to the memory status value or a third predefined value when the sector status value for the particular memory sector is not equal to the memory status value.

9. The one or more non-transitory computer-readable media recited in claim 7, wherein the first circuitry changes the memory status value by increasing the memory status value by one when a full-memory erase operation is performed on the memory.

10. The one or more non-transitory computer-readable media recited in claim 7, wherein the reconfigurable hardware modeling device is a hardware emulator or an FPGA-based prototyping device.

11. The one or more non-transitory computer-readable media recited in claim 7, wherein the hardware model of the circuit design further comprises:
a hardware model of a processor, the hardware model of a processor conducting various memory operations on the hardware model of the memory.

12. The one or more non-transitory computer-readable media recited in claim 7, wherein the memory is a flash memory.

\* \* \* \* \*